(12) United States Patent
Fishburn

(10) Patent No.: US 10,483,043 B2
(45) Date of Patent: Nov. 19, 2019

(54) APPARATUSES, MULTI-CHIP MODULES AND CAPACITIVE CHIPS

(71) Applicant: Micron Technology, Inc., Boise, ID (US)

(72) Inventor: Fred D. Fishburn, Aptos, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/439,036

(22) Filed: Jun. 12, 2019

(65) Prior Publication Data

US 2019/0295775 A1 Sep. 26, 2019

Related U.S. Application Data

(60) Continuation of application No. 16/266,715, filed on Feb. 4, 2019, which is a continuation of application No. 15/994,807, filed on May 31, 2018, now Pat. No. 10,236,127, which is a division of application No. 15/675,977, filed on Aug. 14, 2017, now Pat. No. 10,014,115, which is a division of application No.

(Continued)

(51) Int. Cl.
| | |
|---|---|
| *H01G 4/38* | (2006.01) |
| *H01G 4/012* | (2006.01) |
| *H01G 4/12* | (2006.01) |
| *H05K 1/16* | (2006.01) |
| *H01L 49/02* | (2006.01) |
| *H01G 4/30* | (2006.01) |
| *H01L 23/64* | (2006.01) |
| *H01L 25/18* | (2006.01) |
| *H01L 23/00* | (2006.01) |
| *H01G 4/40* | (2006.01) |

(52) U.S. Cl.
CPC .......... *H01G 4/385* (2013.01); *H01G 4/012* (2013.01); *H01G 4/12* (2013.01); *H01G 4/30* (2013.01); *H01L 23/642* (2013.01); *H01L 28/00* (2013.01); *H05K 1/162* (2013.01); *H01G 4/40* (2013.01); *H01L 24/13* (2013.01); *H01L 24/16* (2013.01); *H01L 25/18* (2013.01); *H01L 2224/131* (2013.01); *H01L 2224/13147* (2013.01); *H01L 2224/16265* (2013.01); *H01L 2924/19041* (2013.01); *H01L 2924/19104* (2013.01); *H05K 2201/09763* (2013.01)

(58) Field of Classification Search
CPC ............................ H01H 4/385; H01H 4/30
USPC ...................................................... 257/303
See application file for complete search history.

(56) References Cited

U.S. PATENT DOCUMENTS

| | | | | |
|---|---|---|---|---|
| 5,414,588 | A | * | 5/1995 | Barbee, Jr. .......... C23C 14/0036 361/304 |
| 5,621,607 | A | * | 4/1997 | Farahmandi .......... H01G 9/038 361/502 |

(Continued)

*Primary Examiner* — Jami Valentine Miller
(74) *Attorney, Agent, or Firm* — Wells St. John P.S.

(57) ABSTRACT

Some embodiments include a capacitive chip having a plurality of capacitive units. The individual capacitive units include alternating electrode layers and dielectric layers in a capacitor stack. The capacitor stack extends across an undulating topography. The undulating topography has peaks and valleys with the peaks being elevationally offset relative to the valleys by a distance within a range of from about 30 microns to about 100 microns. The capacitor stack includes at least about 10 total layers. Some embodiments include apparatuses and multi-chip modules having capacitor chips.

12 Claims, 14 Drawing Sheets

Related U.S. Application Data

15/004,282, filed on Jan. 22, 2016, now Pat. No. 9,767,962.

(56) References Cited

U.S. PATENT DOCUMENTS

| | | | | |
|---|---|---|---|---|
| 6,103,571 | A * | 8/2000 | Li | H01L 27/10852 |
| | | | | 438/255 |
| 6,299,752 | B1 * | 10/2001 | Strange | C25D 11/12 |
| | | | | 205/152 |
| 6,411,494 | B1 * | 6/2002 | Watt | H01L 23/49822 |
| | | | | 257/E23.062 |
| 8,779,849 | B2 | 7/2014 | Hollis | |
| 2006/0039100 | A1 * | 2/2006 | Asano | B32B 5/022 |
| | | | | 361/508 |
| 2006/0098388 | A1 * | 5/2006 | Kirchner | H01G 9/155 |
| | | | | 361/502 |
| 2010/0020473 | A1 * | 1/2010 | Prymak | H01G 9/012 |
| | | | | 361/523 |
| 2011/0043962 | A1 * | 2/2011 | Azais | H01G 9/048 |
| | | | | 361/301.5 |
| 2012/0236467 | A1 * | 9/2012 | Kang | B82Y 10/00 |
| | | | | 361/502 |
| 2014/0115373 | A1 | 4/2014 | Ghodsi | |
| 2015/0028449 | A1 * | 1/2015 | Adkisson | H01L 21/76224 |
| | | | | 257/532 |

\* cited by examiner

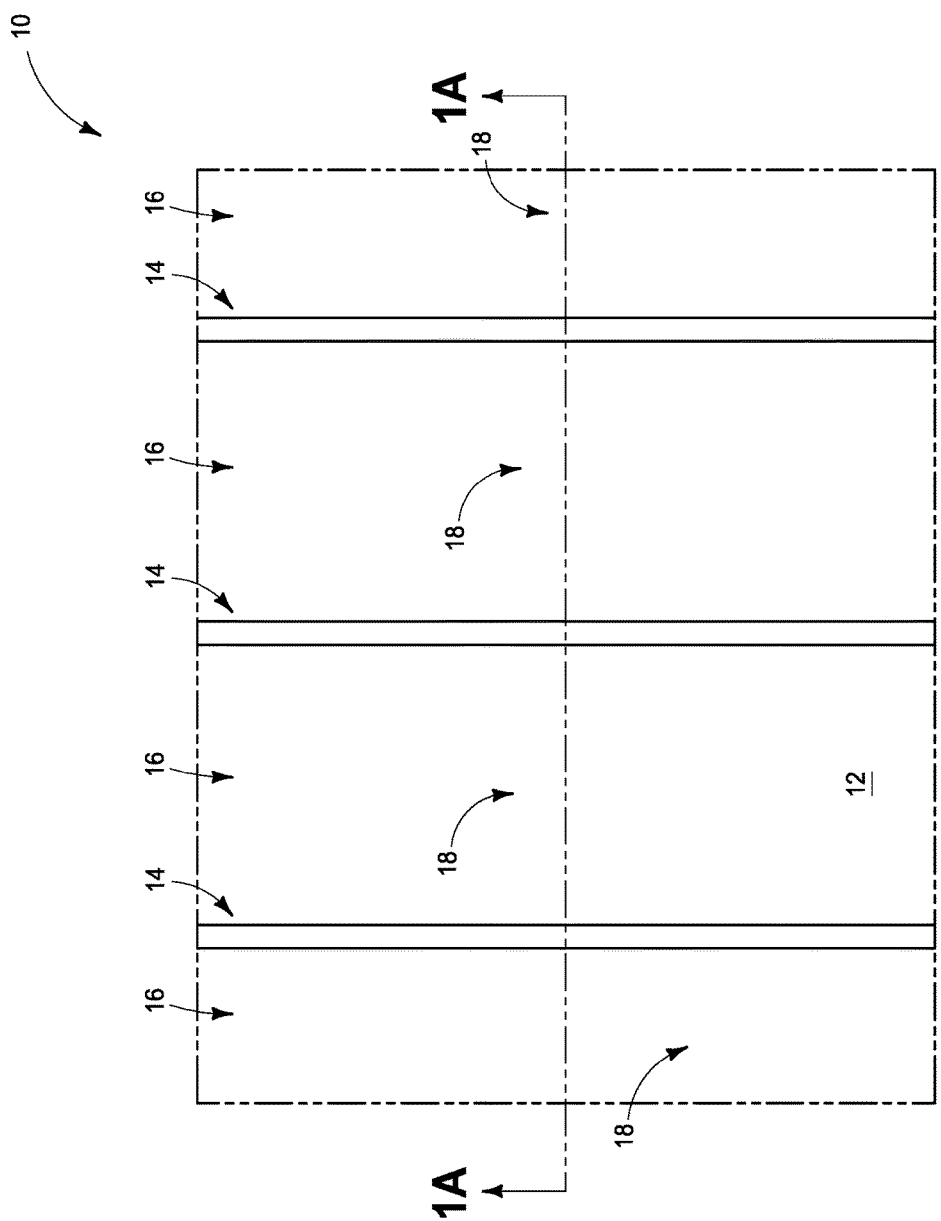

US 10,483,043 B2

APPARATUSES, MULTI-CHIP MODULES AND CAPACITIVE CHIPS

RELATED PATENT DATA

This patent resulted from a continuation of U.S. patent application Ser. No. 16/266,715, which was filed Feb. 4, 2019, and which is hereby incorporated herein by reference; which resulted from a continuation of U.S. patent application Ser. No. 15/994,807, which was filed May 31, 2018, which issued as U.S. Pat. No. 10,236,127, and which is hereby incorporated herein by reference; which resulted from divisional of U.S. patent application Ser. No. 15/675,977, which was filed Aug. 14, 2017, which issued as U.S. Pat. No. 10,014,115, and which is hereby incorporated herein by reference; which resulted from a divisional of U.S. patent application Ser. No. 15/004,282, which was filed Jan. 22, 2016, which issued as U.S. Pat. No. 9,767,962, and which is hereby incorporated herein by reference.

TECHNICAL FIELD

Multi-chip modules, capacitive chips, and apparatuses comprising capacitive devices.

BACKGROUND

Improvements in the design of semiconductor devices consistently involve an increase in both operating frequency and capacity of such devices. In many cases, these improvements are made with little increase, if not a decrease, in the size of these devices. As a result, density of components, such as transistors, on each of these devices has greatly increased. However, advancements in this regard have not been without drawbacks. For example, as operating frequencies and capacities of semiconductor devices have increased, so has the amount of noise generated from the increases in transistor switching, a drawback that is been even more difficult to address as a result of decreases in signal margins associated with higher frequencies and lower power supply voltages.

An approach that has been used to reduce unwanted noise has been the use of decoupling capacitors. As a result, high-frequency signals may be filtered from power supply voltages provided to, and derived in, semiconductor devices.

Another example use of capacitors is to provide power backup. For instance, there may be latency associated with write operations to nonvolatile memory storage devices. As a result, a queue may be utilized to temporarily store write commands and/or data until non-volatile memory commands can execute each command serially. Example implementation for such queue involves using a volatile memory buffer cache such that write data are written first to the volatile memory buffer cache and subsequently to solid-state memory when the solid-state memory is available. A problem which may occur is that data intended to be stored in a solid-state device may be lost if the device loses power while data is being written to the volatile memory. Capacitors may be used to provide backup power in the event of power failure, and specifically to provide sufficient backup power to enable data transfer from the buffer cache to nonvolatile memory.

Capacitors may additionally, or alternatively, serve numerous other purposes relative to integrated circuitry besides the purposes specifically described in the examples provided above.

In many applications it is desirable to provide capacitors separately from one or more integrated circuit chips. For instance, capacitors may be provided on a capacitive chip within a multi-chip module; with a "capacitive chip" being a chip for which a substantial purpose is to provide one or more capacitors. There is a continuing goal to reduce costs and improve capacitors associated with capacitive chips.

BRIEF DESCRIPTION OF THE DRAWINGS

FIGS. 1 and 1A are a diagrammatic top view and a diagrammatic cross-sectional side view, respectively, of a construction at a process stage of an example embodiment method for fabricating an example embodiment capacitive chip. The view of FIG. 1A is along the line 1A-1A of FIG. 1.

DETAILED DESCRIPTION OF THE ILLUSTRATED EMBODIMENTS

Some embodiments include capacitive chips which have a plurality of capacitive units. The individual capacitive units include alternating electrode layers and dielectric layers in a capacitor stack, and such capacitor stack extends across an undulating topography. The capacitor stack may comprise at least about 10 total layers, and the capacitive units may have capacitance within a range of from about 1 picofarad (pf) to about 200 microfarads (μF) under voltage within a range of from about 1 volt (V) about 5V. In some embodiments, the total capacitance amongst all capacitive units on a capacitive chip may be within a range of from about 10 microfarads (µF) to about 200 µF under voltage within a range of from about 1 volt (V) about 5V. In some embodiments, capacitive density of a memory chip may be within a range of from about 1 µF/mm$^2$ to about 20 µF/mm$^2$, with maximum voltage preferably being within a range of from about 1.5V to about 3.6V. In some embodiments, capacitive volume of a memory chip may be within a range of from about 10 µF/mm$^3$ to about 400 µF/mm$^3$, with maximum voltage preferably being within a range of from about 1.5V to about 3.6V. Example embodiments are described with reference to FIGS. 1-13.

Figure 1A:
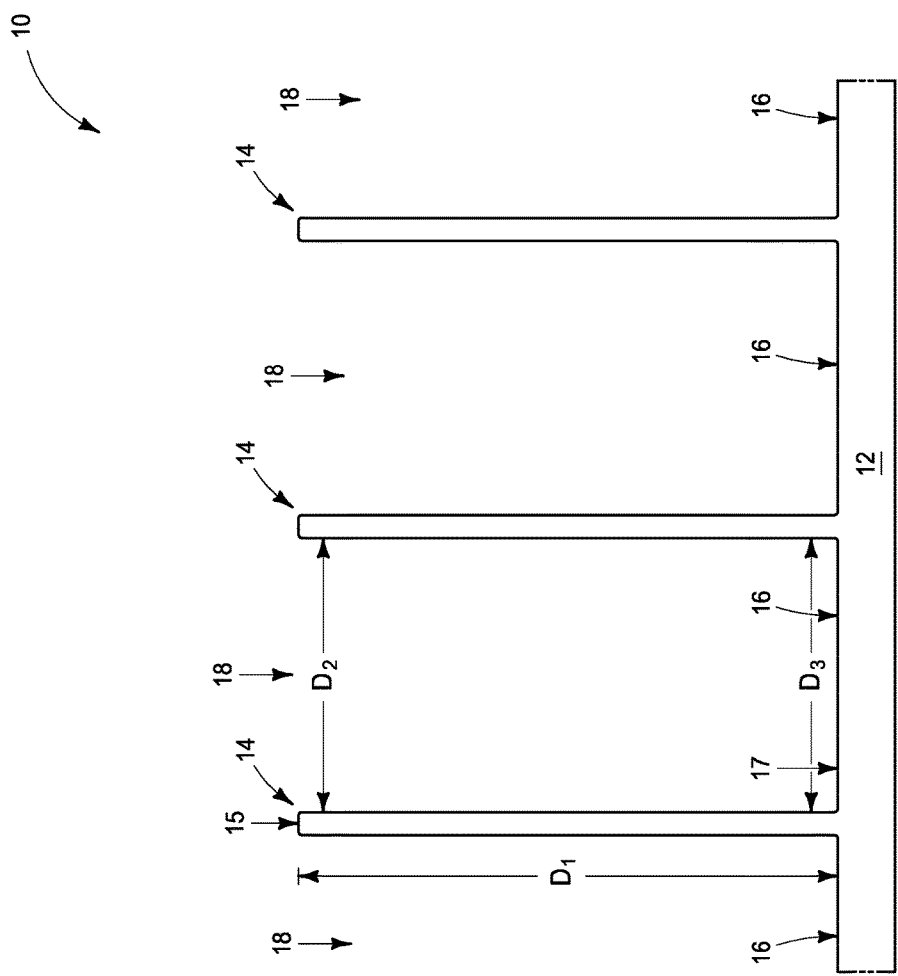

Referring to FIGS. 1 and 1A, a construction 10 is shown to comprise a substrate 12 having an undulating topography thereover. The undulating topography comprises peaks 14 and valleys 16. Top surfaces 15 of the peaks 14 are elevationally offset from surfaces 17 of valleys 16 by distances $D_1$. Such distances may be, for example, within a range of from about 30 microns (µ) to about 100µ. Top regions of peaks 14 are spaced one another by a distance $D_2$, and bottom regions of the peaks 14 are spaced one another by a distance $D_3$. In the shown embodiment $D_2$ and $D_3$ are about the same as one another, but in other embodiments $D_2$ and $D_3$ may be substantially different from one another. For instance, if the valleys 16 are formed by a deep etch into substrate 12, the distance $D_3$ may be substantially smaller than the distance $D_2$. In some example embodiments $D_2$ and $D_3$ may be within a range of from about 1µ to about 3µ. In some example embodiments $D_2$ may be within a range of from about 2µ to about 3µ, and $D_3$ may be within a range of from about 0.5µ to about 1.5µ.

In some embodiments the valleys 16 may be considered to extend within openings 18 between the peaks 14. In the illustrated embodiment, such openings correspond to trenches. In other embodiments, the undulating topography may comprise other arrangements of peaks and valleys besides, or in addition to, the illustrated trenches. In embodiments in which the openings 18 correspond to trenches, the distances $D_2$ and $D_3$ may be considered to correspond to top and bottom widths, respectively, within the trenches.

In some embodiments the substrate 12 may be a semiconductor substrate. For instance, the substrate 12 may comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. For instance, the substrate may comprise <110>monocrystalline silicon; and the trenches 18 may be formed with etchant comprising potassium hydroxide.

In some embodiments substrate 12 may comprise other materials in addition to, or alternatively to, semiconductor materials. For instance, substrate 12 may correspond to glass or other insulative material which is either self-supporting, or supported by a semiconductor substrate.

Figure 2:
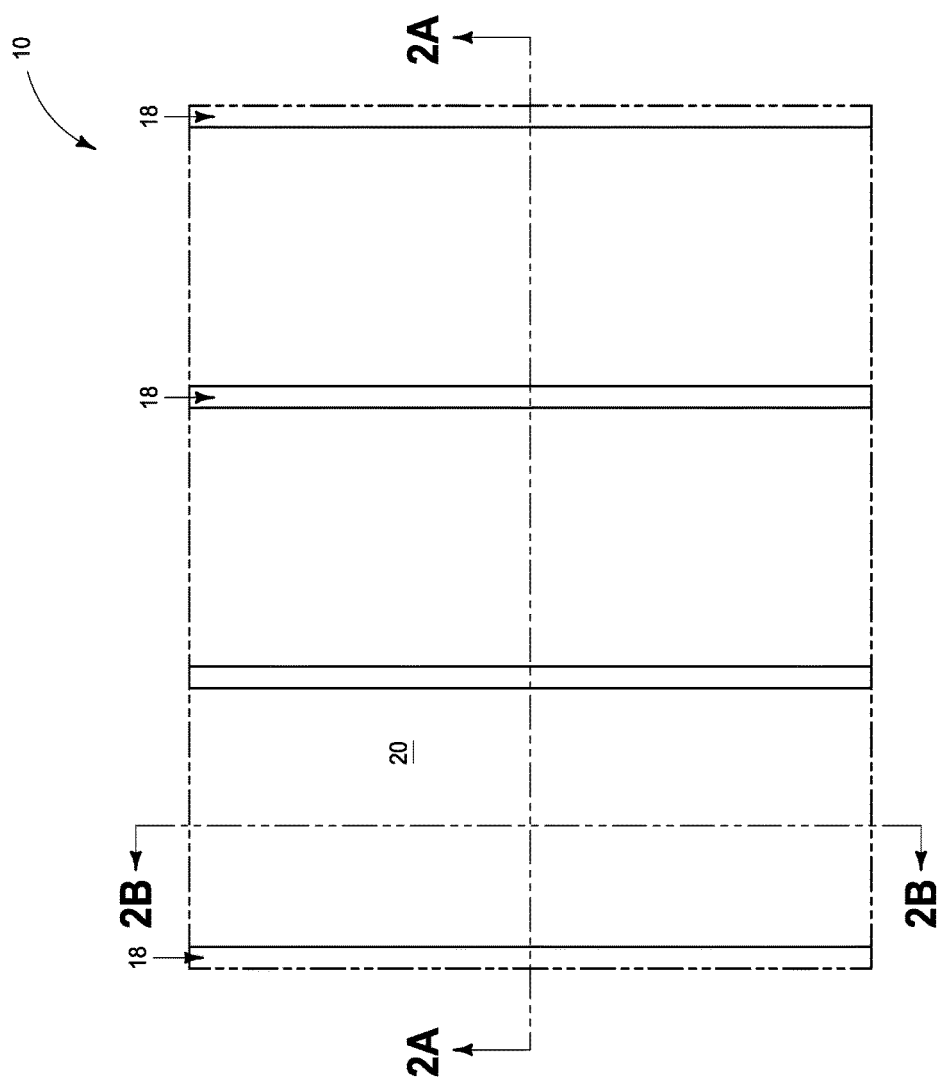
FIGS. 2, 2A and 2B are a diagrammatic top view and diagrammatic cross-sectional side views of the construction of FIGS. 1 and 1A at a process stage following that of FIGS. 1 and 1A. The view of FIG. 2A is along the lines 2A-2A of FIGS. 2 and 2B, and the view of FIG. 2B is along the lines 2B-2B of FIGS. 2 and 2A.
Figure 2A:
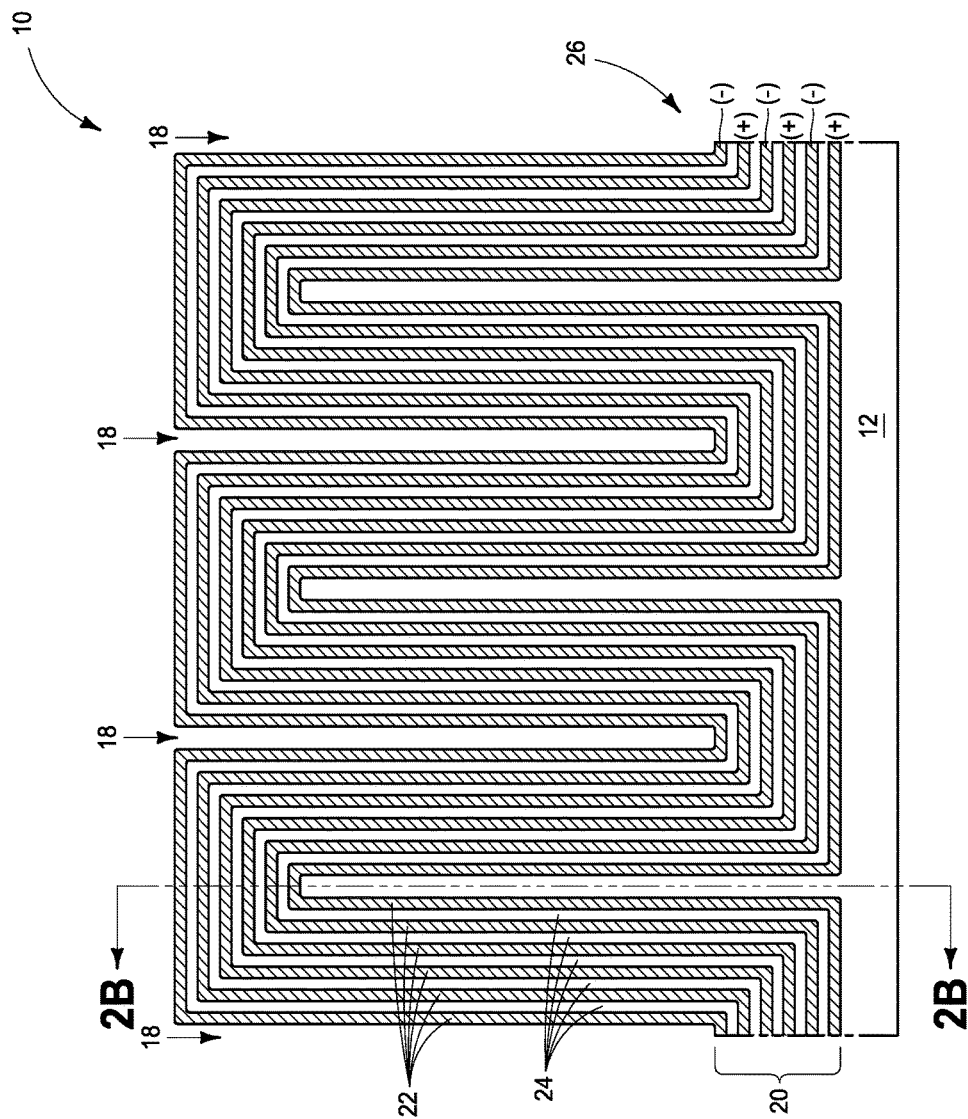
Figure 2B:
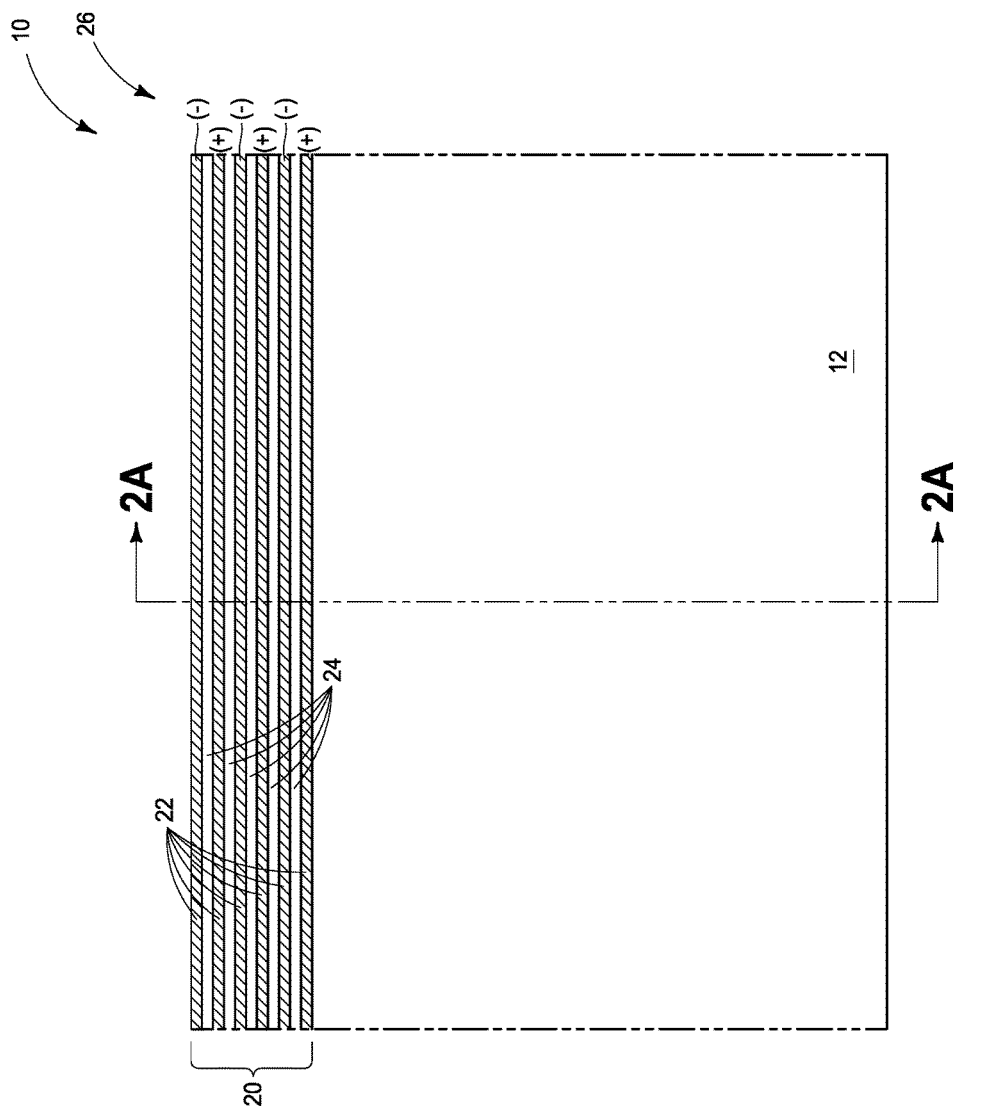

Referring to FIGS. 2, 2A and 2B, a capacitor stack 20 is formed over the undulating surface of a substrate 12, and in the illustrated embodiment is formed within trenches 18. The capacitor stack comprises alternating electrode layers 22 and dielectric layers 24.

The electrode layers 22 may comprise any suitable conductive material or combination of materials; and in some embodiments may comprise, consist essentially of, or consist of one or more metals (for instance, titanium, tungsten, etc.), metal-containing compositions (for instance, metal nitrides, metal silicides, etc.) and/or conductively-doped semiconductor materials (for instance, conductively-doped silicon, conductively-doped germanium, etc.). The electrode layers may be homogeneous (as shown), or may comprise two or more discrete materials. In some embodiments all of the electrode layers may comprise a same composition as one another; and in other embodiments at least one of the electrode layers may comprise a different composition relative to at least one other of the electrode layers.

The dielectric layers may comprise any suitable insulative material or combination of materials; and in some embodiments may comprise, consist essentially of, or consist of one or more oxides (for instance, hafnium oxide, zirconium oxide, silicon dioxide, aluminum oxide, etc.) and/or one or more non-oxide insulative materials (for instance, silicon nitride, etc.). The dielectric layers may be homogeneous (as shown), or may comprise two or more discrete materials. In some embodiments all of the dielectric layers may comprise a same composition as one another; and in other embodiments at least one of the dielectric layers may comprise a different composition relative to at least one other of the dielectric layers.

The electrode layers 22 and dielectric layers 24 may be formed to any suitable thicknesses. In some embodiments such layers are formed to thicknesses within a range of from about 5 nm to about 20 nm. The dielectric layers and electrode layers may have a same thickness as one another in some embodiments, and in other embodiments the dielectric layers may have different thicknesses relative to the electrode layers. All of the electrode layers 22 may have about a same thickness as one another (as shown), or at least one of the electrode layers may have a different thickness relative to at least one other of the electrode layers. All of the dielectric layers may have about a same thickness as one another (as shown), or at least one of the dielectric layers may have a different thickness relative to at least one other of the dielectric layers. Layers have "about a same thickness as one another" if the thicknesses of the layers are the same to within reasonable tolerances of fabrication and measurement.

The electrode layers 22 are subdivided into sets of a first polarity (diagrammatically illustrated as "+") and a second polarity (diagrammatically illustrated as "−"). The first and second polarity electrode layers alternate with one another throughout the stack 20, and such enables the entire thickness of stack 20 to operate as a single capacitive unit 26. Generally, the second polarity will be opposite to the first polarity.

The capacitance of the capacitive unit 26 may be tailored by modifying the total number of layers within the capacitive unit 26; with capacitive units having more layers also having more capacitance than capacitive units having fewer layers, all other things being equal. In some embodiments the total number of layers will be at least about 10 layers, at least about 30 layers, at least about 50 layers, etc.; and in some embodiments will be within a range of from about 10 layers to about 100 layers. The capacitance of the capacitive unit 26 may also be tailored by modifying thicknesses of the various electrode layers and/or dielectric layers within the capacitor stack 20. Additionally, or alternatively, the capacitance of the capacitive unit 26 may be tailored modifying the composition of the various electrode layers and/or dielectric layers within the capacitor stack 20. Accordingly, the capacitive characteristics of the capacitive unit 26 may be readily tailored for different applications. In some embodiments the capacitive unit 26 will be configured to have a capacitance within a range of from about 1 pF to about 200 µF under voltage within a range of from about 1V to about 5V; in some embodiments will be configured to have a capacitance within a range of from about 0.01 µF to about 100 µF under voltage within a range of from about 1V to about 5V, etc. In some embodiments, capacitive density of a memory chip may be within a range of from about 1 µF/mm$^2$ to about 20 µF/mm$^2$, with maximum voltage preferably being within a range of from about 1.5V to about 3.6V. In some embodiments, capacitive volume of a memory chip may be within a range of from about 10 µF/mm$^3$ to about 400 µF/mm$^3$, with maximum voltage preferably being within a range of from about 1.5V to about 3.6V.

Figure 3:
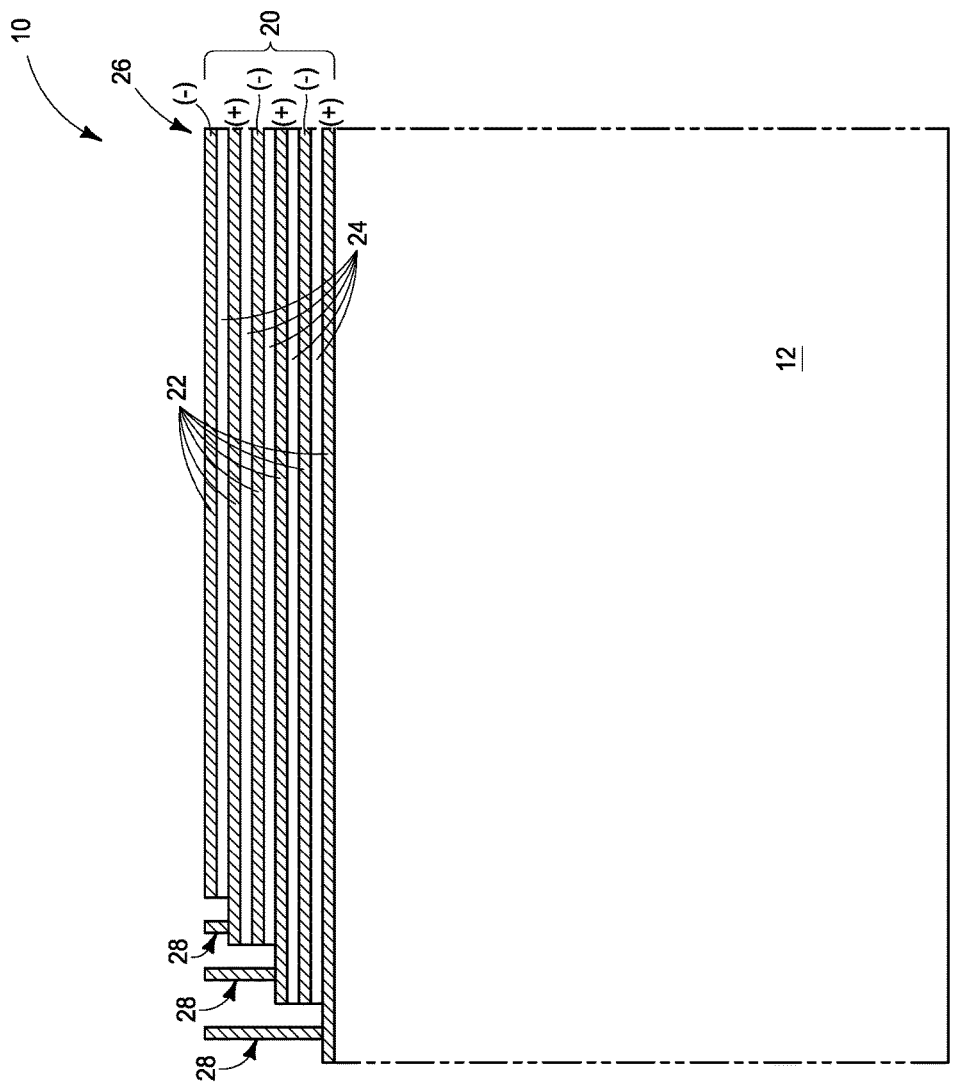
FIG. 3 is a diagrammatic cross-sectional side view of the construction of FIG. 2B at a process stage following that of FIG. 2B.

The electrode layers 22 are connected to appropriate circuitry to provide the desired polarity to such layers. Any suitable architecture may be utilized for connecting the electrode layers to other circuitry. For instance, FIG. 3 shows the cross-section of FIG. 2B at a subsequent processing stage after the layers 22 and 24 of capacitor stack 20 have been subjected to appropriate etching to form a staircase pattern throughout the capacitor stack. Such staircase pattern exposes upper surfaces of the electrode layers 22 having desired "+" polarity, and subsequently conductive interconnects 28 are formed to electrically contact the exposed upper surfaces. The interconnects 28 may comprise any suitable electrically conductive composition or combination of compositions; and in some embodiments may comprise, consist essentially of, or consist of one or more metals (for instance, copper, tungsten, etc.), metal-containing compositions (for instance, metal nitrides, metal silicides, alloys of two or more metals, etc.) and/or conductively-doped semiconductor materials (for instance, conductively-doped silicon, conductively-doped germanium, etc.).

FIG. 3 shows a region in which the electrode layers having desired "+" polarity are connected to electrically conductive interconnects. Another analogous region may be established where the electrode layers having desired "−" polarity are connected to the conductive interconnects.

Figure 4:
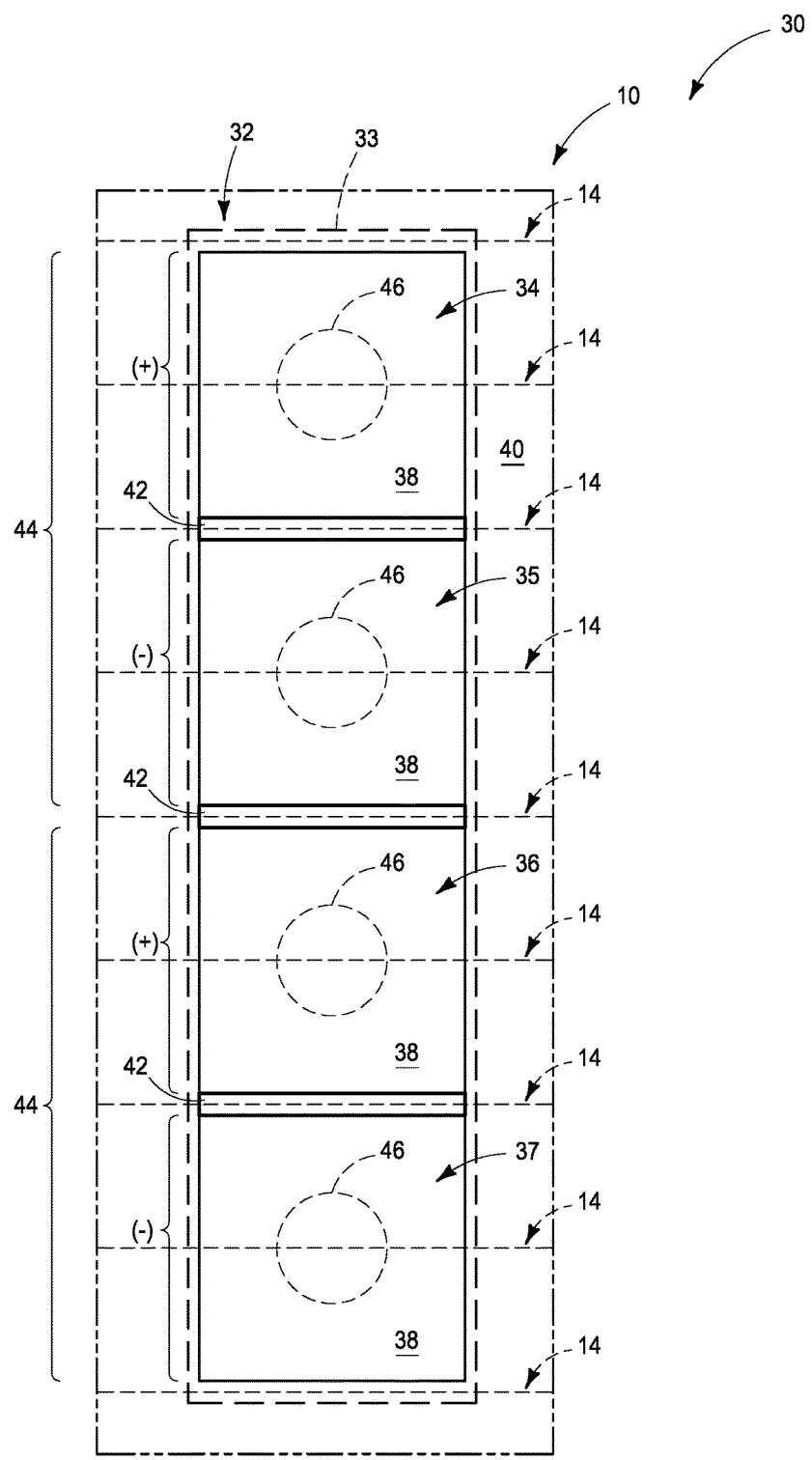
FIG. 4 is a diagrammatic top view of a region of an example embodiment capacitive chip.

In some embodiments, capacitive unit 26 is one of a plurality of capacitive units supported by a capacitive chip, and the interconnects 28 of FIG. 3 extend to a conductive pad which provides a conductive bonding surface for electrical connection to circuitry external of the capacitive chip. FIG. 4 is a diagrammatic top view of a region of a capacitive chip 30 incorporating the construction 10 of FIGS. 1-3. The capacitive chip includes a capacitive unit 32. A dashed-line 33 approximately demarcates a periphery of the capacitive unit.

The capacitive unit 32 includes conductive pads 34-37; with the conductive pads 34 and 36 being electrically coupled with "+" polarity electrodes, and the conductive pads 35 and 37 being electrically coupled with "−" polarity electrodes. In the shown embodiment, the conductive pads 34-37 all comprise a same material 38. Such material may be any suitable conductive material, and in some embodiments may comprise metal (for instance, titanium, tungsten, copper, etc.) and/or metal-containing compositions (for instance, metal nitride, metal silicide, metal carbide, etc.). In other embodiments, one or more of the conductive pads may comprise a different material than at least one other conductive pad.

Electrically insulative material 40 surrounds the capacitive unit 32. Such electrically insulative may comprise any suitable material or combination of materials; including, for example, spin-on dielectric, borophosphosilicate glass, etc.

The peaks 14 are shown in dashed-line view in FIG. 4 to indicate that such peaks are under other materials. In the illustrated embodiment, the peaks are elongated as lines, such as would occur in embodiments of the type illustrated in FIGS. 1 and 1A where trenches 18 extend into a substrate material. Staircase patterns analogous to that described in FIG. 3 may be along tops of the peaks 14 under the pads 34-37 to electrically connect electrodes 22 of the capacitor stack 20 (shown in FIGS. 2, 2A, 2B and 3) to the conductive pads 34-37 through interconnects 28 of the type described with reference to FIG. 3.

The pads 34-37 are electrically separated from one another by dielectric material 42 provided between the pads. Such dielectric material may comprise any suitable material, including, for example, silicon dioxide, silicon nitride, etc. In some embodiments the materials 40 and 42 may be the same composition as one another, and in other embodiments the materials 40 and 42 may be different from one another. Also, although the same material 42 is shown between all of the conductive pads 34-37, in other embodiments different insulative materials may be provided between some conductive pads as compared to the insulative material provided between other conductive pads.

A "+" polarity region and an adjacent "−" polarity region may be considered to form a base capacitive structure 44. Accordingly, the example embodiment capacitive unit 32 of FIG. 4 comprises two base capacitive structures 44. The capacitance of a capacitive unit scales with the number of base capacitive structures incorporated into such capacitive unit. Accordingly, capacitance within an individual capacitive unit may be adjusted by tailoring the number of base capacitive structures incorporated into such capacitive unit.

The conductive pads 34-37 may be connected to circuitry external of the capacitive chip 30 through any suitable architecture. Conductive structures 46 are diagrammatically illustrated in FIG. 4 as being electrically coupled with the conductive pads 34-37. Such conductive structures 46 are shown in dashed-line view so that they may be readily distinguished from the adjacent conductive pads. The conductive structures 46 would be on top of the conductive pads, and may correspond to, for example, interconnects which extend to wiring or other suitable routing circuitry.

The capacitive unit 32 may be one of a plurality of capacitive units associated with a capacitive chip. The various capacitive units may have a same capacitance as one another, or may have different capacitances depending on, for example, the number of base capacitive structures 44 incorporated into the capacitive units, the relative size of the base capacitive structures, etc.

Figure 5:
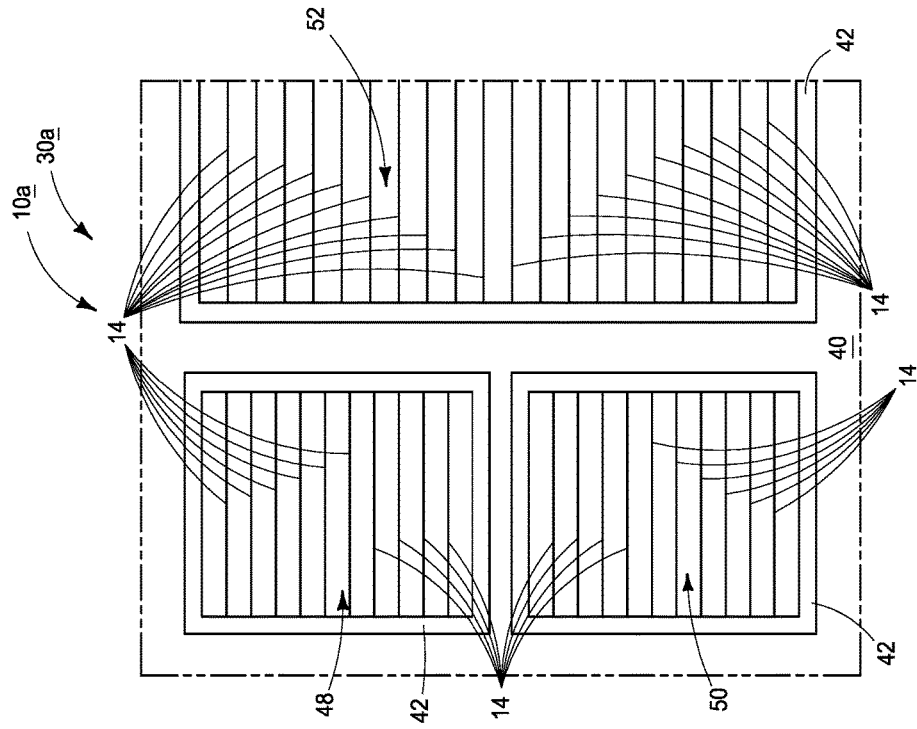

In some embodiments, a capacitive chip may be formed to have numerous regions which each has an undulating topography analogous to the topography described above with reference to FIGS. 1 and 1A. For instance, FIG. 5 shows a construction 10a having three regions 48, 50 and 52 which each comprises peaks 14 and valleys (not labeled) forming an undulating topography. The regions 48 and 50 are the same size as one another, and the region 52 is about twice as big as the regions 48 and 50.

Insulative material 40 is between the regions 48, 50 and 52, and in the illustrated embodiment another insulative 42 is along an outer periphery of each of the individual regions. In some embodiments, the material 42 may be omitted.

The regions 48, 50 and 52 may be formed by, for example, patterning such regions into a semiconductor material utilizing masking and etching. Alternatively, the regions 48, 50 and 52 may be formed with other suitable processing.

Figure 6:
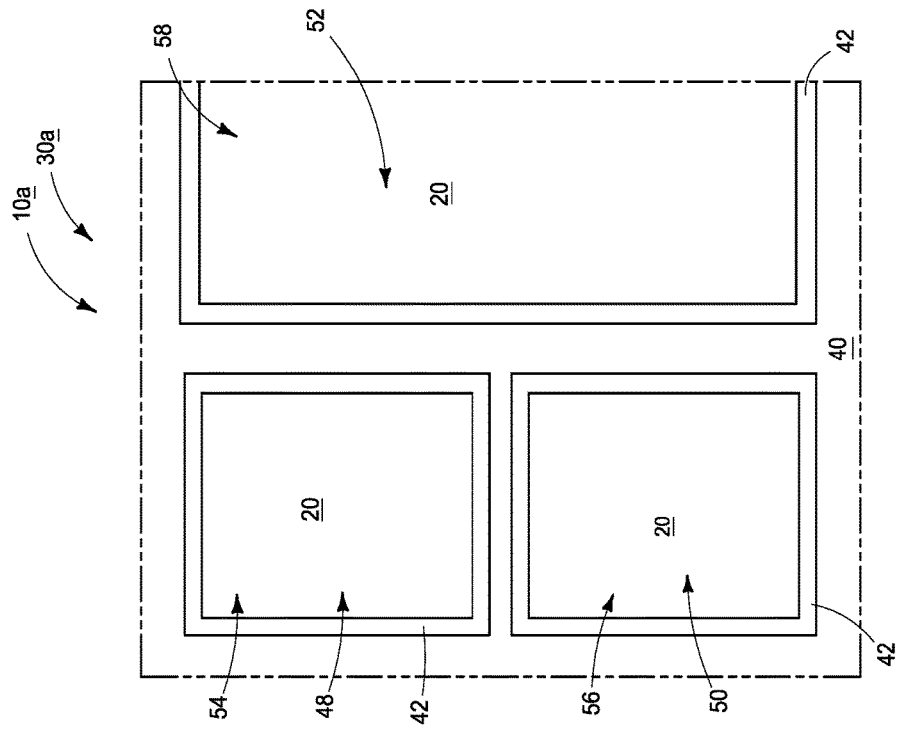
FIGS. 5 and 6 are diagrammatic top views of a region of an example embodiment capacitive chip showing example process stages for forming multiple capacitive units.

A capacitor stack of the type described above with reference to FIGS. 2, 2A and 2B as stack 20 may be formed as an expanse across an entire upper surface of construction 10a, and subsequently such stack may be patterned to form isolated capacitive units 54, 56 and 58 within the regions 48, 50 and 52, respectively; as shown in FIG. 6.

The processing of FIGS. 5 and 6 advantageously forms a plurality of capacitive units 54, 56 and 58 across a capacitive chip; with the capacitive units all comprising the same capacitor stack 20. The specific capacitances of the individual capacitive units 54, 56 and 58 may be tailored by adjusting the relative dimensions of the individual capacitive units. For instance, the capacitive unit 58 is illustrated to be about twice as large as the capacitive units 54 and 56. Accordingly, the capacitive unit 58 may comprise twice as many of the base capacitive structures 44 (FIG. 4) as the capacitive units 54 and 56, and may therefore have double the capacitance of the capacitive units 54 and 56.

Figure 7:
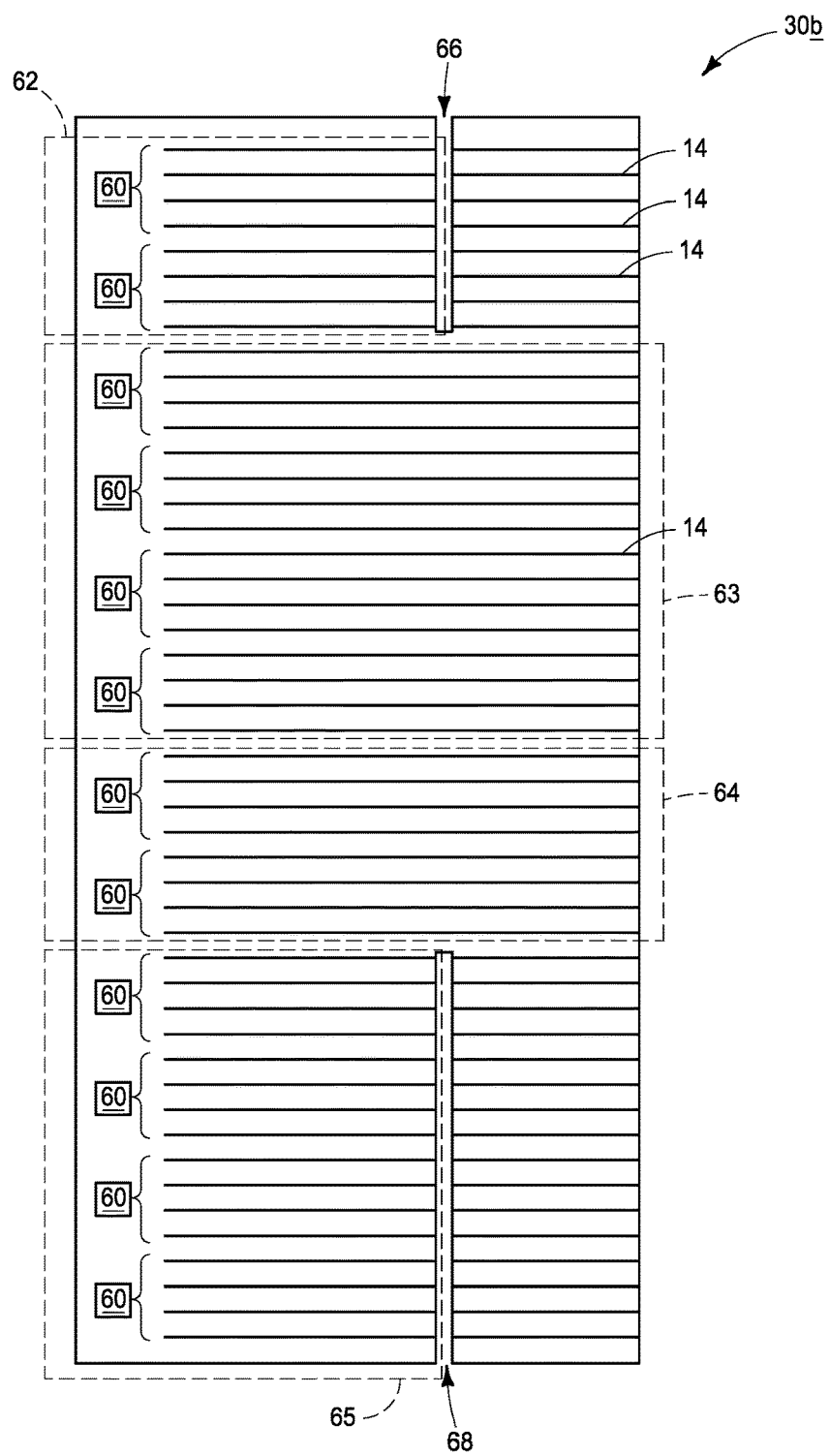
FIG. 7 is another diagrammatic top view of a region of an example embodiment capacitive chip showing multiple capacitive units.

In some embodiments, the regions 54, 56 and 58 of FIG. 6 may be considered to have length and width dimensions. The length dimensions may be adjusted to tailor the number of base units 44 (FIG. 4) within the individual capacitive units, and the width dimensions may adjusted to tailor the total capacitance within each base unit. For instance, FIG. 7 is a diagrammatic and schematic view of a capacitive chip 30b showing linear peak regions 14 (only some of which are labeled) and associated conductive pads 60. The conductive pads 60 may be considered schematic representations of an electrical contact of a base capacitive unit 44 (FIG. 4). In the illustrated representation of FIG. 7, each pad is associated with four peaks 14 of the undulating topography. In other embodiments, the individual pads may be associated with more than four peaks or less than four peaks of the undulating topography.

Capacitive units 62-65 are diagrammatically illustrated in FIG. 7. The capacitive unit 62 comprises two base units, the capacitive unit 63 comprises four base units, the capacitive unit 64 comprises two base units, and the capacitive unit 65 comprises four base units. Breaks (e.g., slits, kerfs, etc.) 66 and 68 extend into the chip 30b and alter the widths of capacitive units 62 and 65 relative to the widths of the other capacitive units 63 and 64. Accordingly, even though capacitive units 63 and 65 both comprise four base capacitive structures 60, the capacitive unit 65 has less capacitance than the capacitive units 63 because the capacitive units 65 has a narrower width than the capacitive unit 63. Similarly, the capacitive unit 62 has a narrower width than the capacitive unit 64.

In some embodiments, the pads 60 within capacitive units 63 and 64 may be considered to be associated with full-width base capacitive structures. Such full-width base capacitor structures may have a given capacitance, and the capacitive units 63 and 64 may have a total capacitance determined by the number of full-width base capacitor structures incorporated therein. For instance, in some embodiments each full-width base capacitor structure may have a capacitance of about 0.25 μF, and accordingly capacitive unit 64 may have a total capacitance of about 0.5 μF while capacitive unit 63 has a total capacitance of about 1 μF.

The capacitive units 62 and 65 have partial-width base capacitor structures, and accordingly have less capacitance then analogous capacitive units having full-width base capacitor structures. The relative amount of capacitance within a partial-width base capacitor structure as compared to a full-width base capacitor structure scales roughly in proportion to the dimension of the partial-width as compared to the dimension of the full-width.

Figure 8:
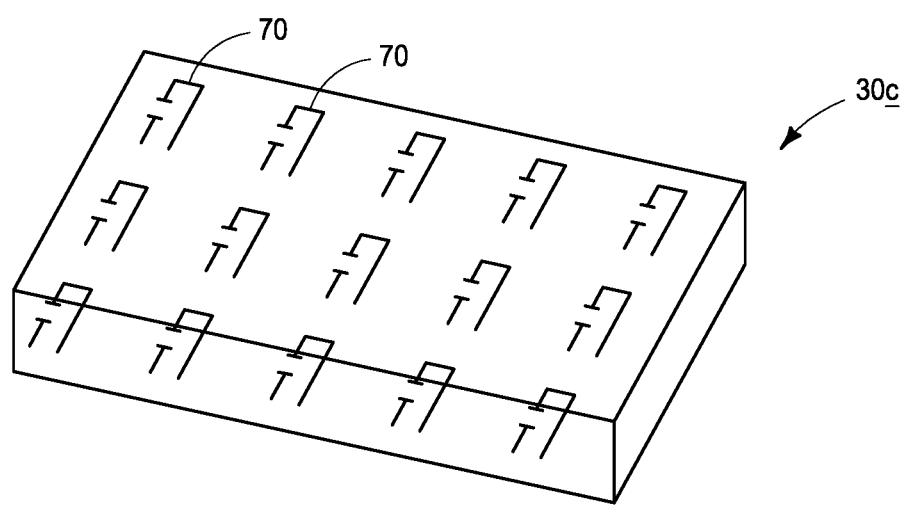
FIG. 8 is three-dimensional schematic representation of an example embodiment capacitive chip containing multiple capacitive units.

The capacitive chips 30, 30a and 30b described above in FIGS. 4-7 may comprise any suitable dimensions. FIG. 8 diagrammatically illustrates a capacitive chip 30c comprising a plurality of individual capacitive units 70 (only some of which are labeled). The capacitive units may comprise substantially the same total capacitance as one another in some embodiments (with the term "substantially the same" meaning that the total capacitance is the same to within reasonable tolerances of fabrication and measurement). In other embodiments, at least one of the capacitive units may comprise a substantially different total capacitance than one or more other capacitive units. The various capacitive units may comprise any of the capacitive unit structures described above with reference to the preceding figures of this disclosure.

Methodology described above with reference to FIGS. 1-7 may enable the capacitive chip 30c to be formed to have at least about one capacitive unit per square millimeter, and in some embodiments to have at least about four capacitive units per square millimeter. In some example embodiments the capacitive chip 30c may have a surface area of about 7 mm$^2$, and may comprise from about 10 capacitive units (i.e. capacitors) to about 30 capacitive units. In some embodiments all of the capacitive units on the capacitive chip together have total capacitance within a range of from about 10 microfarads to about 200 microfarads under voltage within a range of from about 1 volt to about 5 volts. In some embodiments, capacitive density of a memory chip may be within a range of from about 1 μF/mm$^2$ to about 20 μF/mm$^2$, with maximum voltage preferably being within a range of from about 1.5V to about 3.6V. In some embodiments, capacitive volume of a memory chip may be within a range of from about 10 μF/mm$^3$ to about 400 μF/mm$^3$, with maximum voltage preferably being within a range of from about 1.5V to about 3.6V.

Figure 9:
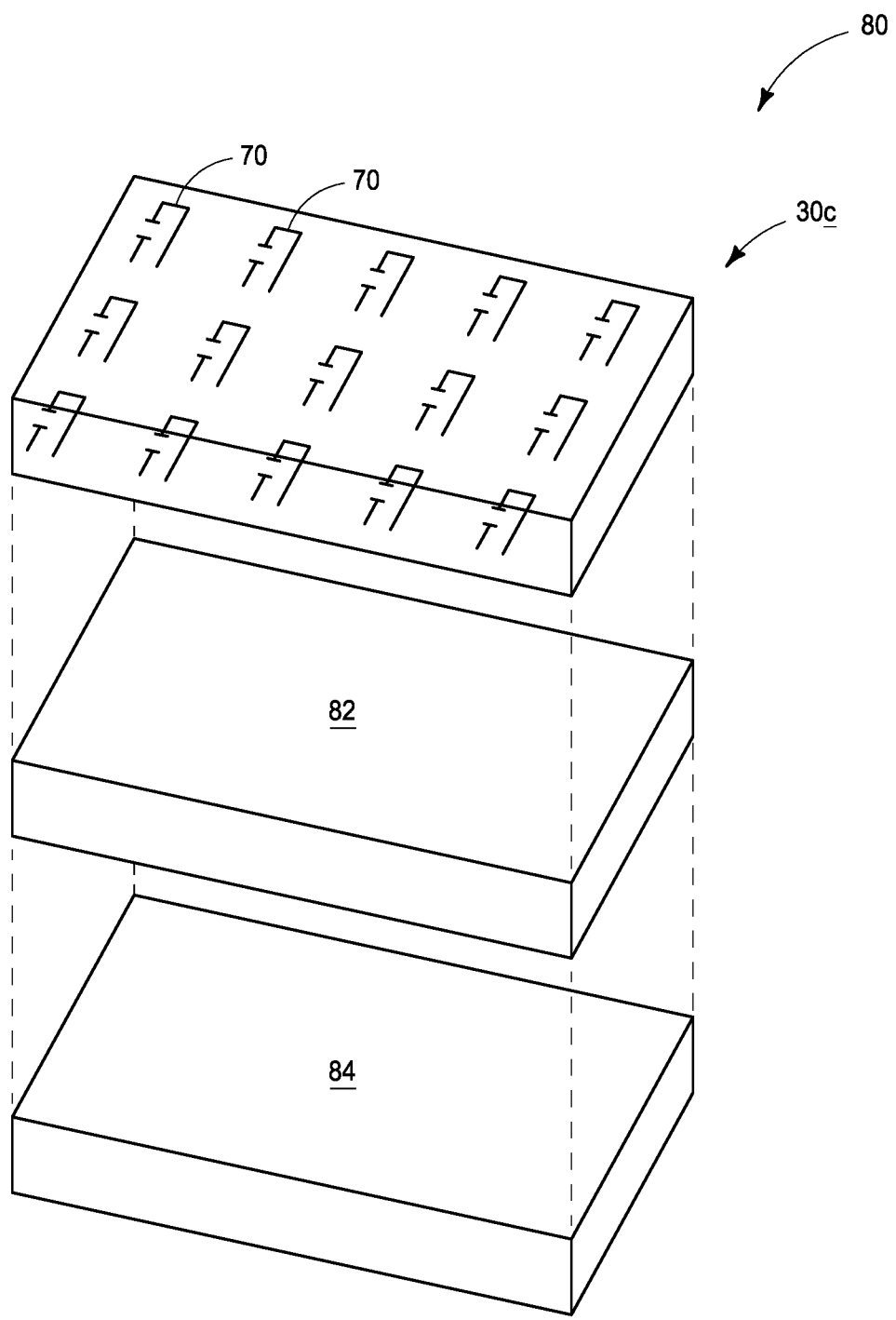
FIG. 9 is three-dimensional schematic representation of an example embodiment multi-chip module containing an example embodiment capacitive chip.

The capacitive chip 30c may be incorporated into a multi-chip module or other apparatus. For instance, FIG. 9 illustrates an exploded perspective view of a multi-chip module 80 which includes an integrated circuit chip 82, a signal distribution component 84 and the capacitive chip 30c arranged in a stacked configuration. The signal distribution component may be coupled to traces on a semiconductor substrate (e.g., via conductive balls, solder bumps, etc.). Moreover, the signal distribution component 84 may be coupled to an external controller to receive power supply voltage and/or control signals and may further receive signals from other external devices. Although the stacked configuration has the signal distribution component 84 on an opposing side of the integrated circuit chip 82 from the capacitive unit 30c, in other embodiments of the capacitive unit may be between the signal distribution component and the integrated circuit chip. In some embodiments the signal distribution component may be considered to be part of a power supply which provides power to one or both of the integrated circuit chip and the capacitive chip.

The integrated circuit chip 82, the capacitive chip 30c, and the signal distribution component 84 may be coupled by respective redistribution layers (not shown) and/or by die interconnects, such as pads, solder bumps, microbumps, copper pillars, etc. Any suitable number and/or size of interconnects may be used, allowing for respective resistances (e.g., effective series resistance) between the integrated circuit chip 82, the capacitive chip 30c and/or the signal distribution component 84 to be increased or decreased as desired.

Figure 10:
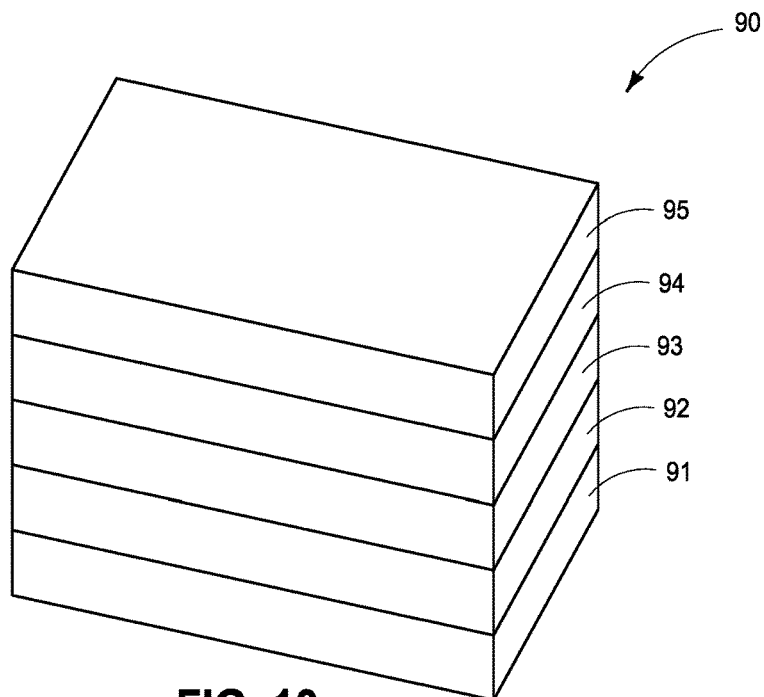
FIG. 10 is another three-dimensional schematic representation of an example embodiment multi-chip module containing at least one example embodiment capacitive chip.

Although the apparatus 80 of FIG. 9 shows three components within a multi-chip module, in other embodiments there may be more than three individual components within the multi-chip module, or fewer than three individual components within the multi-chip module. For instance, FIG. 10 shows a construction 90 comprising five components 91-95 within a multi-chip module. At least one of such components is a capacitive chip (i.e., a capacitive chip analogous to the chip 30c of FIGS. 8 and 9), and other components may be integrated circuit chips, signal distribution components, etc. In some embodiments at least two of the modules 91-95 may be capacitive chips. One of the capacitive chips may have a different function than another. For instance, one of the capacitive chips may provide backup power to enable a programming operation to be completed in the event of power failure; and another of the capacitive chips may provide filtering to stabilize power distribution to an integrated circuit chip.

Figure 11:
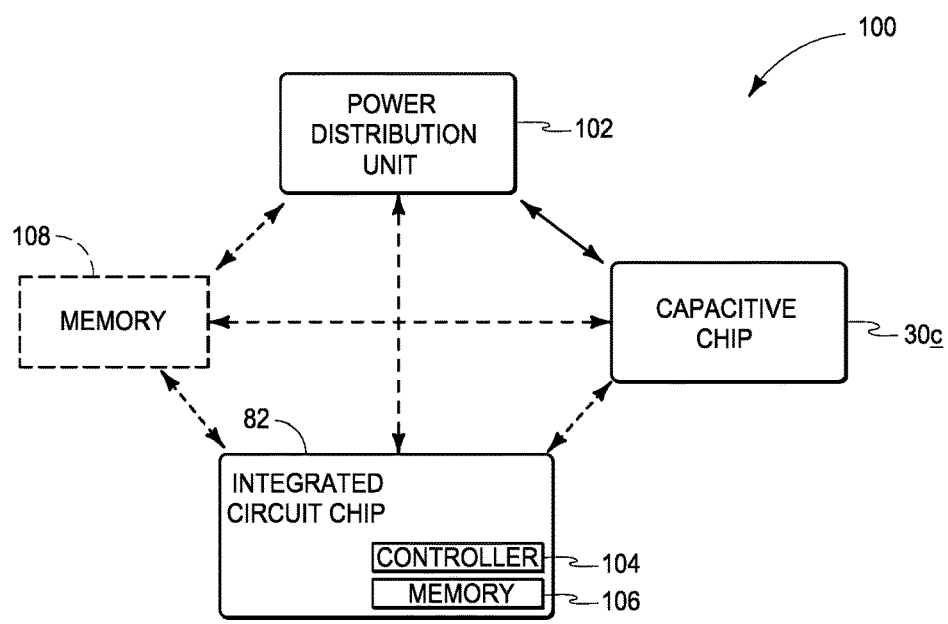
FIG. 11 is another schematic representation of an example embodiment multi-chip module containing an example embodiment capacitive chip.

FIG. 11 schematically illustrates another example embodiment multi-chip module 100. Such module includes a capacitive chip 30c, an integrated circuit chip 82, and a power distribution 102 configured to provide a power supply voltage. In some embodiments the capacitive chip is electrically coupled between the power supply and the integrated circuit chip and is configured to modify power from the power supply to the integrated circuit chip and/or to provide backup power to the chip in the event of power failure. In some embodiments the integrated circuit chip is electrically coupled to at least one of the capacitive chip and the power distribution component. In such embodiments, the capacitive chip may be directly coupled to the power distribution unit, and may be utilized to stabilize power from the distribution unit regardless of whether the capacitive unit is also directly coupled to the integrated circuit chip or not.

In the illustrated embodiment, the integrated circuit chip comprises a controller 104 and memory 106. The controller may be utilized for providing memory commands to the memory. Additional memory 108 may be provided in a separate memory chip. Such additional memory may also receive memory commands from the controller 104. The additional memory 108 may be electrically coupled to one or both of the power dissipation unit 102 and the capacitive chip 30c, in addition to being electrically coupled to the integrated circuit chip 82. Although the integrated circuit chip 82 is illustrated to comprise some memory in addition to controller, in other embodiments the integrated circuit chip may only comprises the controller and any memory within the apparatus 100 may be provided by one or more additional memory chips analogous to the chip 108.

In some embodiments, a capacitive chip may be fabricated to comprise first capacitive units on a first side and second capacitive units on an opposing second side, as described with reference to FIGS. 12 and 13.

Figure 12:
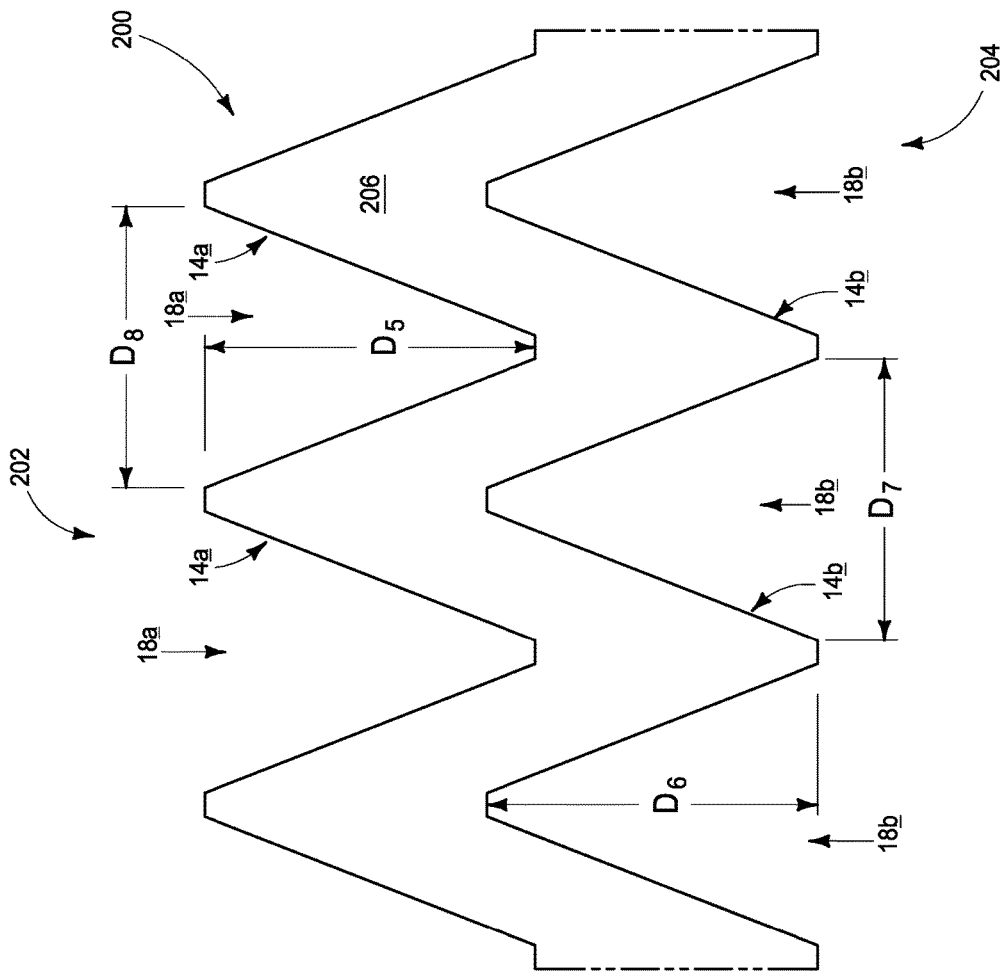
FIG. 12 is diagrammatic cross-sectional side view of a construction at a process stage of another example embodiment method for fabricating another example embodiment capacitive chip.

FIG. 12 shows a construction 200 having a first side 202 and an opposing second side 204. The sides 202 and 204 may be a top and bottom of a wafer or other suitable substrate 206. In some embodiments the substrate may have a thickness from side 202 to side 204 within a range of from about 200 micrometers to about 1000 micrometers. First trenches 18a extend downwardly from the first side, and second trenches 18b extend upwardly from the second side. First peaks 14a are along the first trenches 18a, and second peaks 14b are along the second trenches 18b. In the shown embodiment, the first trenches 18a extend into base regions of the second peaks 14b, and the second trenches 18b extend into base regions of the first peaks 14a. Outer surfaces of the peaks 14a are elevationally offset from inner surfaces trenches 18a by distances $D_5$, and outer surfaces of the peaks 14b are elevationally offset from inner surfaces trenches 18b by distances $D_6$. The distances $D_5$ and $D_6$ may be about the same as one another in some embodiments, or may be different from one another in other embodiments. The distances $D_5$ and $D_6$ may be, for example, within a range of from about 30μ to about 100μ. Outer regions of peaks 14a are spaced from one another by a distance $D_8$, and outer regions of the peaks 14b are spaced from one another by a distance $D_7$. The distances $D_7$ and $D_8$ may be about the same as one another in some embodiments, or may be different from one another in other embodiments. In some example embodiments $D_7$ and $D_8$ may be within a range of from about 1μ to about 3μ.

Figure 13:
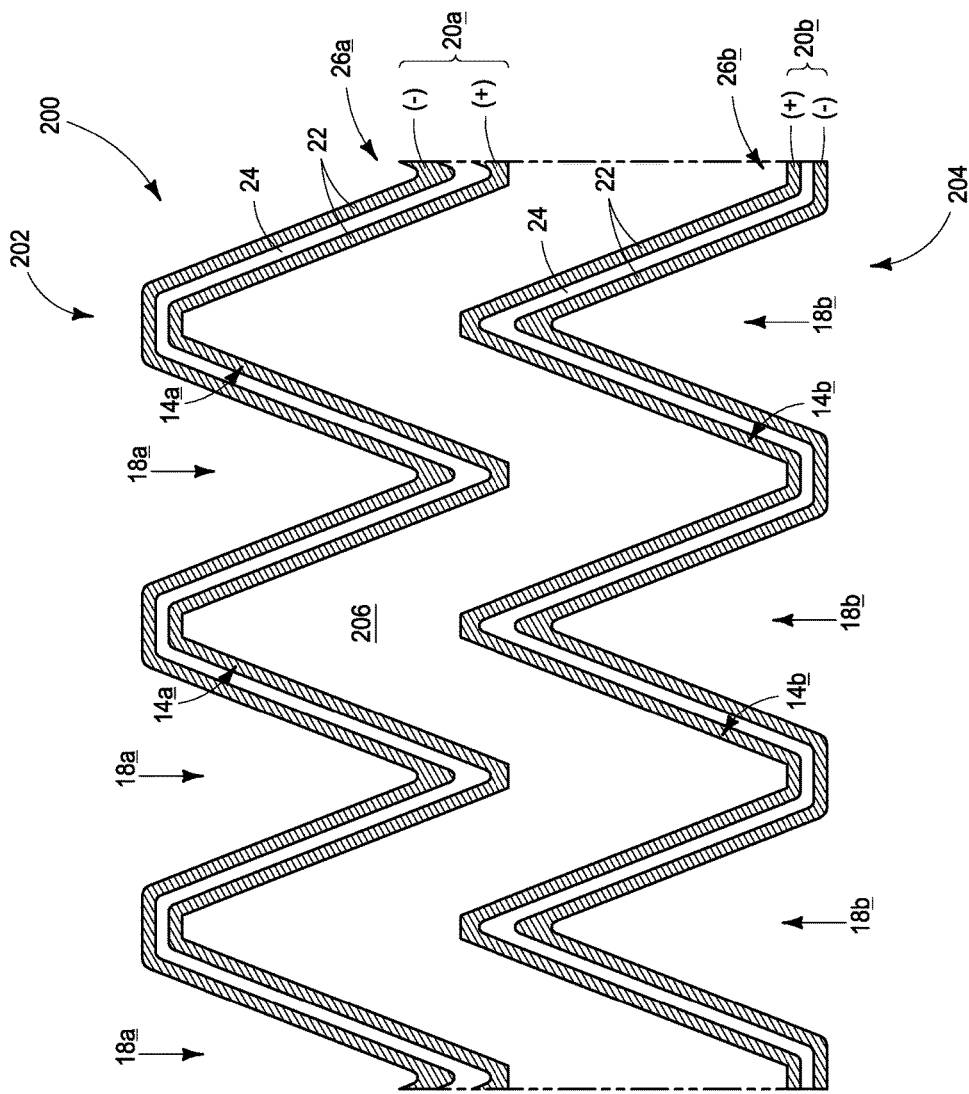
FIG. 13 is a diagrammatic cross-sectional side view of the construction of FIG. 12 at a process stage following that of FIG. 12.

Referring to FIG. 13, alternating electrode layers 22 and dielectric layers 24 are formed within trenches 18a and 18b, and across peaks 14a and 14b. Such form a first capacitor stack 20a along first side 202, and form a second capacitor stack 20b along second side 204.

Any suitable number of electrode layers may be utilized in the capacitor stacks 20a and 20b. The capacitor stacks 20a and 20b may have the same number of electrode layers as one another in some embodiments, or may have different numbers of electrode layers relative to one another. The capacitor stacks 20a and 20b are incorporated into capacitive units 26a and 26b. The stacks 20a and 20b, and capacitive units 26a and 26b, may comprise layers and configurations of the types described with reference to stack 20 and capacitive unit 26 of FIGS. 2, 2A and 2B.

The formation of capacitive units along opposing sides 202 and 204 may be considered to form a double-sided capacitive chip. The double-sided capacitive chip may be configured to achieve suitable capacitive density and/or volume for particular applications. In some embodiments, capacitive density of a memory chip of the type illustrated in FIG. 13 may be within a range of from about 0.005 $\mu F/mm^2$ to about 2 $\mu F/mm^2$. In some embodiments, capacitive volume of the memory chip may be within a range of from about 0.01 $\mu F/mm^3$ to about 5 $\mu F/mm^3$. In some embodiments, the capacitors may be suitable for operation to at least about 5V, and in some embodiments may be suitable for operation within a range of from about 5V to about 25V.

The structures described herein may be incorporated into electronic systems. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

Some embodiments include a capacitive chip comprising a plurality of capacitive units. The individual capacitive units include alternating electrode layers and dielectric layers in a capacitor stack. The capacitor stack extends across an undulating topography. The undulating topography comprises peaks and valleys with the peaks being elevationally offset relative to the valleys by a distance within a range of from about 30 microns to about 100 microns. The capacitor stack comprises at least about 10 total layers. The capacitive units may have capacitance within a range of from about 1 picofarad to about 200 microfarads under voltage within a range of from about 1 volt to about 5 volts. In some embodiments, capacitive density of a memory chip may be within a range of from about 1 $\mu F/mm^2$ to about 20 $\mu F/mm^2$, with maximum voltage preferably being within a range of from about 1.5V to about 3.6V. In some embodiments, capacitive volume of a memory chip may be within a range of from about 10 $\mu F/mm^3$ to about 400 $\mu F/mm^3$, with maximum voltage preferably being within a range of from about 1.5V to about 3.6V.

Some embodiments include an apparatus having a power supply, an integrated circuit chip, and a capacitive chip electrically coupled between the power supply and the integrated circuit chip and configured to modify power from the power supply to the integrated circuit chip and/or to provide backup power to the chip in the event of power failure. The capacitive chip comprises a plurality of capacitive units. The individual capacitive units comprise alternating electrode layers and dielectric layers in a capacitor stack. The capacitor stack extends across an undulating topography having elevational offsets of from about 30 microns to about 100 microns. The capacitor stack comprises at least about 10 total layers. The capacitive units may have capacitance within a range of from about 1 picofarad to about 200 microfarads under voltage within a range of from about 1 volt to about 5 volts. In some embodiments, capacitive density of a memory chip may be within a range of from about 1 $\mu F/mm^2$ to about 20 $\mu F/mm^2$, with maximum voltage preferably being within a range of from about 1.5V to about 3.6V. In some embodiments, capacitive volume of a memory chip may be within a range of from about 10 $\mu F/mm^3$ to about 400 $\mu F/mm^3$, with maximum voltage preferably being within a range of from about 1.5V to about 3.6V.

Some embodiments include a multi-chip module comprising a power distribution component configured to provide a power supply voltage, a capacitive chip electrically coupled to the power distribution component and comprising a plurality of capacitive units, and an integrated circuit chip electrically coupled to at least one of the capacitive chip and the power distribution component. The integrated circuit chip comprises a controller configured to provide memory commands to a memory. The individual capacitive units comprise alternating electrode layers and dielectric layers in a capacitor stack. The capacitor stack extends across an undulating topography. The undulating topography comprises trenches having depths within a range of from about 30 microns to about 100 microns and having bottom widths of at least about 1 micrometer. The capacitor stack comprises at least about 10 total layers. The capacitive units on the capacitive chip together may have total capacitance within a range of from about 10 microfarads to about 200 microfarads under voltage within a range of from about 1 volt to about 5 volts. In some embodiments, capacitive density of a memory chip may be within a range of from about 1 $\mu F/mm^2$ to about 20 $\mu F/mm^2$, with maximum voltage preferably being within a range of from about 1.5V to about 3.6V. In some embodiments, capacitive volume of a memory chip may be within a range of from about 10 $\mu F/mm^3$ to about 400 $\mu F/mm^3$, with maximum voltage preferably being within a range of from about 1.5V to about 3.6V.

Some embodiments include a capacitive chip comprising a first side in opposing relation to a second side. A first set of alternating electrode layers and dielectric layers is along the first side and forms a first capacitor stack. The first capacitor stack extends across a first undulating topography. The first undulating topography comprises first trenches having first depths within a range of from about 30 microns to about 100 microns. The first capacitor stack comprises at least about 10 total layers. A second set of alternating electrode layers and dielectric layers is along the second side and forms a second capacitor stack. The second capacitor stack extends across a second undulating topography. The second undulating topography comprises second trenches having second depths a range of from about 30 microns to about 100 microns. The second capacitor stack comprises at least about 10 total layers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An apparatus, comprising:
   a capacitive chip electrically connected with an integrated circuit chip; the capacitive chip comprising capacitive units, and comprising at least four of the capacitive units per square millimeter, the individual capacitive units each comprising:
   layers in a capacitor stack, the layers being alternating electrode layers and dielectric layers; the capacitor stack extending across an undulating topography having elevational offsets of from about 30 microns to about 100 microns; the electrode layers comprising one or more metals; the dielectric layers comprising one or more oxides; and
   the capacitor stack comprising at least 10 of the layers.

2. The apparatus of claim 1 wherein all of the capacitive units of said plurality are substantially identical to one another in capacitance.

3. The apparatus of claim 1 wherein at least one of the capacitive units of said plurality has a substantially different capacitance than another of the capacitive units of said plurality.

4. The apparatus of claim 1 wherein the capacitor stacks comprise at least 30 of the layers.

5. The apparatus of claim 1 wherein the capacitor stacks comprise at least 50 of the layers.

6. A multi-chip module, comprising:
   a power distribution component configured to provide a power supply voltage;
   a capacitive chip electrically coupled to the power distribution component and comprising capacitive units;
   an integrated circuit chip electrically coupled to at least one of the capacitive chip and the power distribution component, the integrated circuit chip comprising a controller configured to provide memory commands to a memory; and
   wherein individual of the capacitive units of the capacitive chip comprise:
   layers in a capacitor stack, the layers being alternating electrode layers and dielectric layers; the capacitor stack extending across an undulating topography; the undulating topography comprising trenches having depths within a range of from about 30 microns to about 100 microns and having bottom widths of at least about 1 micrometer; the electrode layers comprising one or more metals; the dielectric layers comprising one or more oxides; and the capacitor stack comprising at least 10 of the layers.

7. The multi-chip module of claim 6 wherein the integrated circuit chip is electrically coupled to the capacitive chip.

8. The multi-chip module of claim 6 wherein the capacitor stacks comprise at least 30 of the layers.

9. The multi-chip module of claim 6 wherein the capacitor stacks comprise at least 50 of the layers.

10. The multi-chip module of claim 6 wherein the trenches extend into a semiconductor substrate.

11. The multi-chip module of claim 6 wherein all of the capacitive units of the capacitive chip are substantially identical to one another in capacitance.

12. The multi-chip module of claim 6 wherein at least one of the capacitive units of the capacitive chip has a substantially different capacitance than another of the capacitive units of the capacitive chip.

* * * * *